(12) United States Patent
Heo

(10) Patent No.: US 7,009,296 B1
(45) Date of Patent: Mar. 7, 2006

(54) SEMICONDUCTOR PACKAGE WITH SUBSTRATE COUPLED TO A PERIPHERAL SIDE SURFACE OF A SEMICONDUCTOR DIE

(75) Inventor: Byong Il Heo, Buk-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 86 days.

(21) Appl. No.: 10/759,990

(22) Filed: Jan. 15, 2004

(51) Int. Cl.
   *H01L 23/48* (2006.01)
(52) U.S. Cl. .................. 257/738; 257/774; 257/778; 257/E23.062; 257/E23.067; 257/E23.069
(58) Field of Classification Search ............. 257/774, 257/778, E23.062, E23.067, E23.069
   See application file for complete search history.

(56) References Cited

U.S. PATENT DOCUMENTS

| | | |
|---|---|---|
| 4,530,152 A | 7/1985 | Roche et al. |
| 4,982,265 A | 1/1991 | Watanabe et al. |
| 4,996,587 A | 2/1991 | Hinrichsmeyer et al. |
| 5,138,438 A | 8/1992 | Masayuki et al. |
| 5,198,888 A | 3/1993 | Sugano et al. |
| 5,258,094 A | 11/1993 | Furui et al. |
| 5,266,834 A | 11/1993 | Nishi et al. |
| 5,394,010 A | 2/1995 | Tazawa et al. |
| 5,432,729 A | 7/1995 | Carson et al. |
| 5,514,907 A | 5/1996 | Moshayedi |
| 5,571,754 A | 11/1996 | Bertin et al. ............... 437/209 |
| 5,594,275 A | 1/1997 | Kwon et al. |
| 5,625,221 A | 4/1997 | Kim et al. |
| 5,637,912 A | 6/1997 | Cockerill et al. |
| 5,646,828 A | 7/1997 | Degani et al. |
| 5,668,405 A | 9/1997 | Yamashita |
| 5,677,569 A | 10/1997 | Choi et al. |
| 5,682,062 A | 10/1997 | Gaul |
| 5,696,666 A | 12/1997 | Miles et al. ............... 361/764 |
| 5,723,900 A | 3/1998 | Kojima et al. |
| 5,744,827 A | 4/1998 | Jeong et al. |
| 5,760,471 A | 6/1998 | Fujisawa et al. |
| 5,763,939 A | 6/1998 | Yamashita |
| 5,783,870 A | 7/1998 | Mostafazadeh et al. |
| 5,786,628 A | 7/1998 | Beilstein, Jr. et al. ...... 257/684 |
| 5,801,439 A | 9/1998 | Fujisawa et al. |
| 5,883,426 A | 3/1999 | Tokuno et al. |
| 5,977,640 A | 11/1999 | Bertin et al. |

(Continued)

FOREIGN PATENT DOCUMENTS

EP    0 682 365 A1    11/1995

(Continued)

*Primary Examiner*—Mai-Huong Tran
(74) *Attorney, Agent, or Firm*—Ginnison, McKay & Hodgson, L.L.P.; Serge J. Hodgson

(57) ABSTRACT

Semiconductor packages are disclosed. One semiconductor package includes a semiconductor die with an active surface, an opposite inactive surface, and four peripheral side surfaces. A substrate of the semiconductor package is coupled to one side surface of the semiconductor die. Bond pads of the active surface are coupled to a substrate first surface that is coplanar with the active surface. External interconnects, e.g., solder balls, are formed on a second substrate surface that is perpendicular to the active surface. An insulating layer, e.g., an encapsulant, together covers the active surface and the substrate first surface. An alternative semiconductor package includes two substrates, each attached to a respective one of two opposed side surfaces of the semiconductor die. The remaining two side surfaces of the semiconductor die are exposed. The external interconnects are formed on a third substrate surface that is coplanar with the inactive surface of the semiconductor die.

20 Claims, 14 Drawing Sheets

U.S. PATENT DOCUMENTS

| | | |
|---|---|---|
| 5,986,209 A | 11/1999 | Tandy |
| 6,013,948 A | 1/2000 | Akram et al. |
| 6,057,598 A | 5/2000 | Payne et al. |
| 6,060,778 A | 5/2000 | Jeong et al. |
| 6,072,233 A | 6/2000 | Corisis et al. |
| 6,160,705 A | 12/2000 | Stearns et al. |
| 6,172,419 B1 | 1/2001 | Kinsman |
| 6,180,881 B1 | 1/2001 | Isaak |
| 6,235,554 B1 | 5/2001 | Akram et al. |
| 6,258,632 B1 | 7/2001 | Takebe |
| 6,313,522 B1 | 11/2001 | Akram et al. |
| 6,329,709 B1 | 12/2001 | Moden et al. |
| 6,369,454 B1 | 4/2002 | Chung |
| 6,395,578 B1 | 5/2002 | Shin et al. |
| 6,404,046 B1 | 6/2002 | Glenn et al. |
| 6,407,458 B1 * | 6/2002 | Huemoeller ............... 257/778 |
| 6,426,549 B1 | 7/2002 | Isaak ........................... 257/686 |
| 6,448,506 B1 | 9/2002 | Glenn et al. |
| 6,459,148 B1 | 10/2002 | Chun-Jen et al. |
| 6,486,537 B1 | 11/2002 | Liebhard |
| 6,501,184 B1 | 12/2002 | Shin et al. |
| 6,515,356 B1 | 2/2003 | Shin et al. |
| 6,518,659 B1 | 2/2003 | Glenn |
| 6,577,013 B1 | 6/2003 | Glenn et al. |

FOREIGN PATENT DOCUMENTS

| | | |
|---|---|---|
| EP | 0 948 048 A1 | 10/1999 |
| JP | 2-239651 A | 9/1990 |
| KR | 1999-0065599 | 8/1999 |
| KR | 2000-0065896 | 11/2000 |

* cited by examiner

SEMICONDUCTOR PACKAGE WITH SUBSTRATE COUPLED TO A PERIPHERAL SIDE SURFACE OF A SEMICONDUCTOR DIE

BACKGROUND OF THE INVENTION

1. Field of the Invention

The field of the present invention is semiconductor packaging.

2. Description of the Related Art

One type of conventional semiconductor package includes a rectangular semiconductor die having an active surface with bond pads thereon, an inactive surface opposite the active surface, and four planar side surfaces between the active and inactive surfaces. The inactive surface is attached to a substrate of the semiconductor package with a layer of a die attach adhesive. The substrate includes a first surface and an opposite second surface, each of which includes a plurality of circuit patterns. The circuit patterns of the first surface are electrically coupled to the circuit patterns of the second surface by vias through the substrate. The bond pads of the semiconductor die are electrically coupled to the circuit patterns of the first surface of the substrate by conductive wires. The semiconductor die and the first surface of the substrate are covered by a plastic encapsulant. Finally, a plurality of solder balls are fused to the circuit patterns of the second surface of the substrate to serve as external interconnects for the semiconductor package.

This conventional semiconductor package has several drawbacks. One drawback of the conventional semiconductor package arises from the relatively-long metal wires that electrically couple the semiconductor die to the substrate. The greater the length of the wire, the lesser the electrical efficiency of the package. Restrictions on the length of the metal wires limits the arrangement of the bond pads of the semiconductor die and the design of the electrically conductive circuit patterns of the substrate. Moreover, since the substrate is much larger than the semiconductor die, the conventional semiconductor package is relatively large, which is undesirable in certain applications. Finally, because the semiconductor die is covered by the encapsulant, heat radiation from the semiconductor die is made more difficult.

To reduce the vertical height of the semiconductor package, i.e., the package's thickness between the bottom of the solder balls and the top surface of the encapsulant, the semiconductor die is thinned by a process of grinding, polishing, or etching the inactive surface of the semiconductor die prior to the severing of the semiconductor die from a semiconductor wafer. The thickness of the semiconductor dies of the wafer between their respective active and inactive surfaces is approximately 29 mils prior to the thinning process, and is approximately 6 mils after the thinning process. After the thinning process, the semiconductor dies are singulated from the wafer. However, the reduced thickness of the semiconductor dies creates problems during package assembly, because the thinned wafer and singulated semiconductor dies are difficult to handle, and are susceptible to breakage.

Accordingly, an improved semiconductor package is desirable.

SUMMARY

The present invention includes semiconductor packages that are very near in size to the semiconductor die that is packaged in the semiconductor package, and occupy a small area on an external device, e.g., a printed circuit board, upon which the semiconductor package is mounted.

A first exemplary embodiment of a semiconductor package within the present invention includes a semiconductor die having an active surface, an opposite inactive surface, and four parallel planar peripheral side surfaces that extend from the active surface to the inactive surface. A substrate of the semiconductor package has the shape of a rectangular prism, and is bonded to only a first side surface of the four peripheral side surfaces of the semiconductor die by an adhesive layer. The substrate includes an insulative core, and electrically conductive circuit patterns, including bond fingers on a first surface of the substrate that is coplanar with the active surface, and ball lands on a second surface of the substrate that is perpendicular to the active surface and parallel to the side surface of the semiconductor die, first surface of the substrate and parallel to the active surface of the semiconductor die. Vias extend through the insulative core of the substrate and electrically couple the bond fingers to the ball lands. Metal wires electrically couple bond pads on the active surface of the semiconductor die to the bond fingers. Solder balls are fused to the ball lands. A layer of an insulative encapsulant covers the active surface of the semiconductor die, the first surface of the substrate, and an intervening planar surface of the adhesive layer. The inactive surface and the remaining three side surfaces of the semiconductor die are exposed to the environment. The semiconductor package is mounted so that the active and inactive surfaces of the semiconductor die are perpendicular to a mounting surface of an external device to which the solder balls of the semiconductor package are fused.

In a second exemplary embodiment, two substrates are provided, with each substrate having the shape of a rectangular prism. Each substrate is bonded to a respective one of two opposed parallel side surfaces of the semiconductor die by a respective one of two adhesive layers. Unlike the first embodiment mentioned above, the ball lands and solder balls are formed on a peripheral third surface of the substrate that is in a common plane with the inactive surface of the semiconductor die, rather than on the second surface of the substrate. The encapsulant layer covers the active surface of the semiconductor die and the first surface of each of the two substrates. The inactive surface of the semiconductor die, and two remaining parallel, opposed side surfaces of the semiconductor die are exposed to the environment. The semiconductor package is mounted so that the inactive surface of the substrate and the third surface of the substrate face the mounting surface of the external device.

In a third exemplary embodiment, the conductive wires and the layer of encapsulant of the two embodiments mentioned above are replaced by a protective, interconnective structure that includes: (1) a plurality of insulative layers that successively overlie the active surface of the semiconductor die and the first surface of the substrate(s), and the intervening planar surface of the adhesive layer(s), and (2) a plurality of conductive circuit patterns that extend through and/or on the insulative layers to electrically couple the bond pads of the semiconductor die to the bond fingers of the substrate(s).

The present invention is best understood by reference to the following detailed description when read in conjunction with the accompanying drawings.

BRIEF DESCRIPTION OF THE DRAWINGS

Similar reference numerals are used throughout the drawings as well, detailed descriptions are used to indicate like elements.

DETAILED DESCRIPTION

Figure 1A:
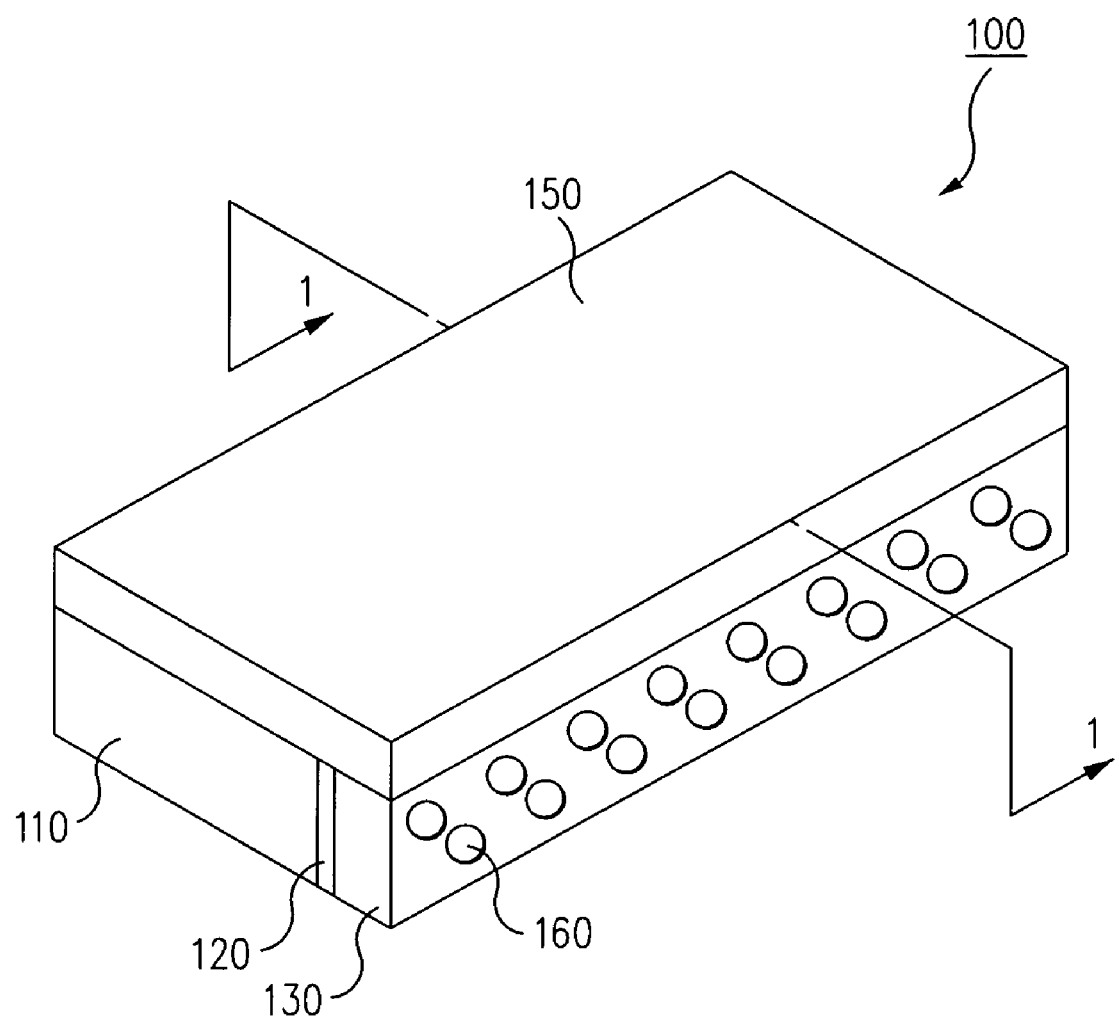
FIG. 1A is a perspective view of a semiconductor package according to one embodiment of the present invention.
Figure 1B:
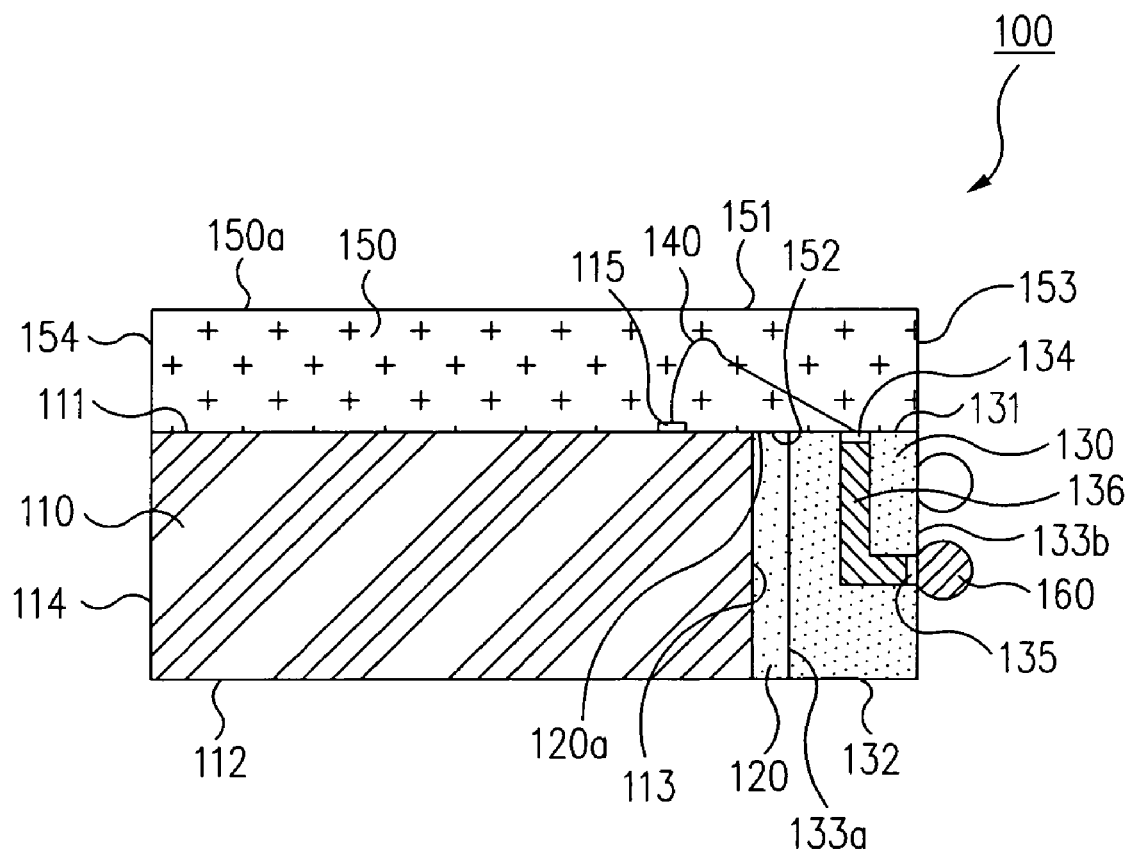
FIG. 1B is a cross-sectional side view taken along the line 1—1 of FIG. 1A.
Figure 1C:
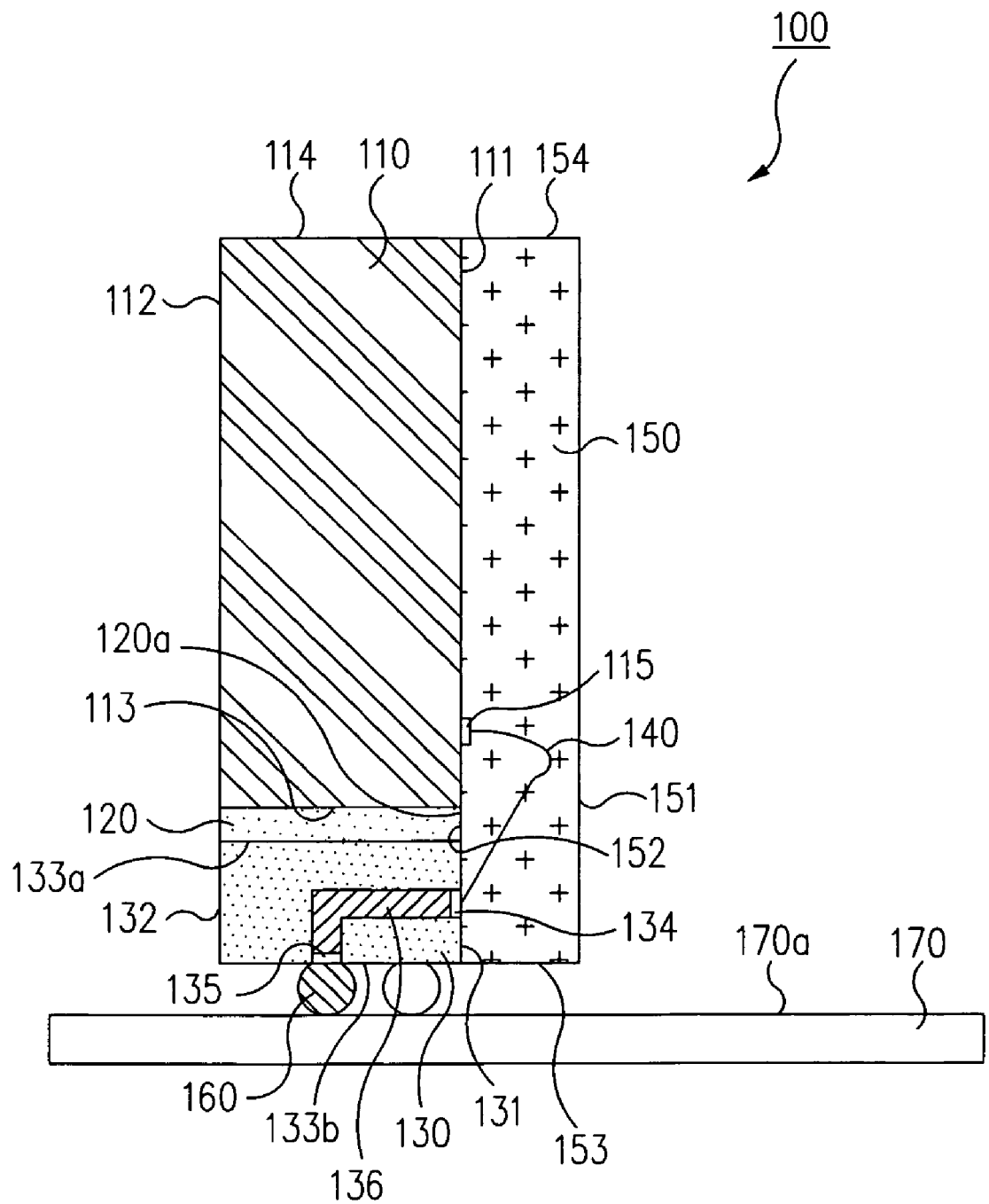
FIG. 1C is a perspective view showing the semiconductor package of FIG. 1A mounted to an external device.

FIG. 1A shows a semiconductor package 100 that includes a substrate 130 that is coupled to one of the four planar peripheral side surfaces of the packaged semiconductor die 110. FIG. 1B provides a sectional view taken along the line 1—1 of FIG. 1A. FIG. 1C shows the semiconductor package 100 mounted on an external device 170, e.g., a printed circuit board.

Referring to FIGS. 1A–1C, the semiconductor package 100 includes a semiconductor die 110, a layer of an insulative adhesive 120 bonded on a peripheral side 113 of the semiconductor die 110, a substrate 130 bonded to the adhesive 120 opposite the semiconductor die 110, a plurality of conductive wires 140 electrically coupling the semiconductor die 110 to the substrate 130, an encapsulant 150 that covers the conductive wires 140, and the active surface 111 of the semiconductor die 110, a planar peripheral surface 120a of the adhesive 120, and a peripheral surface 131 of the substrate 130, all of which surfaces may be coplanar, and a plurality of solder balls 160 fused to a peripheral surface 133b of the substrate 130. It should be understood that the terms "perpendicular," "planar," "parallel," "coplanar," and the like, as used herein and in the claims, include a tolerance, e.g., "perpendicular" includes "approximately perpendicular."

The semiconductor die 110 has the form a rectangular prism, and includes a planar active surface 111 and a planar inactive surface 112 opposed to the active surface 111. The semiconductor die 110 further includes four planar peripheral side surfaces that are between and perpendicular to the active and inactive surfaces 111 and 112. Two of the four peripheral side surfaces, i.e., a side surface 113 and an opposite parallel side surface 114, are shown. A plurality of bond pads 115 are formed at the active surface 111. In this example, all of the bond pads 115 are arranged in a single row adjacent to the third surface 113. The thickness of the semiconductor die 110, which is not back-grinded or otherwise thinned, is approximately 29 mils between the active and inactive surfaces 111, 112.

The layer of adhesive 120 is bonded to the third surface 113 of the semiconductor die 110, and covers the entirety of third surface 113. A planar surface 120a of the adhesive layer 120 is coplanar with active surface 111. Here, the material of the adhesive 120 may be an adhesive tape, an epoxy, or the like. However, the present invention is not limited to any material of the adhesive.

The substrate 130 is bonded to the adhesive 120. The substrate 130 has the form of a rectangular prism, and includes a rectangular major first surface 133a that faces side surface 113 of semiconductor die 110 and is coupled thereto by adhesive 120, a rectangular major second surface 133b opposed to the first surface 133a, and four rectangular planar peripheral side surfaces that are perpendicular to and between the first and second surfaces 133a, 133b. Two of those four peripheral surfaces, i.e., a third surface 131 and an opposite parallel fourth surface 132, are shown. First and second surfaces 133a, 133b have the same, or approximately the same, area as side surface 113 of semiconductor die 110. First surface 133a is entirely covered by the adhesive layer 120. The third surface 131 of the substrate 130 is flush with (i.e., coplanar with) the active surface 111 of the semiconductor die 110, and the fourth surface 132 of the substrate 130 is flush with the inactive surface 112 of the semiconductor die 110. The thickness of substrate 130 between first and second surfaces 133a, 133b is much less than the thickness of semiconductor die 110 between side surfaces 113, 114. Accordingly, the whole size of the semiconductor package 100 is close to that of the semiconductor die. 110 alone.

The substrate 130 includes an electrically insulative core, which may be formed of one or more layers of any suitable insulative material, such as polyimide, epoxy resin, FR4, ceramic, and the like. The substrate 130 further includes a plurality of electrically conductive circuit patterns at the surface of, and within, the core insulative layer of substrate 130, including a plurality of bond fingers 134 at third surface 131 and a plurality of ball lands 135 at the second surface 133b thereof. Here, the ball lands 135 are formed at the second surface 133b in two parallel rows. The ball lands 135 of the two rows alternate, with each ball land 135 of one row being between two ball lands 135 of the other row (except at the ends), so that the ball lands 135 form a zigzag pattern. A plurality of electrically conductive vias 136 extend through the insulative core of substrate 130 between third surface 131 and second surface 133b. Each of the bond fingers 134 is electrically coupled to a respective one of the ball lands 135 by a respective one of the conductive vias 136. The conductive vias 136 each include a right angle bend or joint between a first portion extending inward from the bond finger 134 and third surface 131 that is parallel to first and second surfaces 133a, 133b, and a second portion that extends perpendicularly inward from second surface 133b and the ball land 135. The circuit patterns may be formed of metal, conductive ink, or the like.

Each of the bond pads 115 of the semiconductor die 110 is electrically coupled to a respective one of the bond fingers 134 of the substrate 130 by a respective one of a plurality of electrically conductive wires 140. Here, since the semiconductor die 110 is very close to the substrate 130, and the bond pads 115 are adjacent to side surface 113, the length of the conductive wires 140 is relatively short, thereby improving the electric efficiency of the semiconductor package 100.

The material of the conductive wire 140 may be aluminum (Al), copper (Cu), gold (Au), silver (Ag) and the like.

The active surface 111 of the semiconductor die 110, the bond pads 115, the conductive wires 140, the peripheral surface 120a of the adhesive layer 120, the third surface 131 of the substrate 130, and the bond fingers 134 of semiconductor package 100 are entirely covered by an electrically insulative encapsulant 150, which may be a hardened epoxy mold compound or other plastic, or a hardened liquid encapsulant. The encapsulant 150, includes a planar exposed peripheral first surface 151, and a planar peripheral unexposed second surface 152 that is opposite the first surface 151. The second surface 152 is formed on and bonded to the active surface 111, the adjacent peripheral surface 120a of adhesive layer 120, and the third surface 131 of substrate 130, all of which surfaces are coplanar. The encapsulant 150 also includes four rectangular planar peripheral surfaces that are between and perpendicular to the first and second surfaces 151, 152. Two of those four peripheral surfaces, i.e., a third surface 153 and an opposite parallel fourth surface 154, are shown. The third surface 153 of the encapsulant 150 is flush with the second surface 133b of the substrate 130, and the fourth surface 154 of the encapsulant 150 is flush with the side surface 114 of the semiconductor die 110. Accordingly, the inactive surface 112, and three of the four peripheral side surfaces of the semiconductor die 110 (i.e., the side surface 114, and the two parallel unshown peripheral side surfaces) are exposed to the outside environment, which provides semiconductor package 100 with excellent heat radiation and a near-chip size.

Each of the plurality of solder balls 160 is fused to a respective one of the ball lands 135 of second surface 133b of substrate 130. Since the ball lands 135 are arranged in a zigzag pattern, the solder balls 160 are also form a zigzag pattern.

Semiconductor package 100 is mounted on external device 170 of FIG. 1C by an electrical coupling of the solder balls 160 to corresponding circuit patterns of the external device 170. In particular, the solder balls 160 are fused to the circuit patterns of the external device 170. Electrical signals pass between the semiconductor die 110 and circuit patterns of the external device 170 through the bond pads 115, the conductive wires 140, the bond fingers 134, the electrically conductive vias 136, the ball lands 135, and the solder balls 160. In an alternative embodiment, the solder balls 160 may be omitted or replaced by another type of external interconnect.

In the mounting of FIG. 1C, the semiconductor package 100 is mounted so that side surface 113 of semiconductor die 110, second surface 133b of substrate 130, and peripheral surface 153 of encapsulant 150 are parallel to and face the mounting surface 170a of external device 170. Side surface 114 of semiconductor die 110 and side surface 154 of encapsulant 150 are parallel to, but face away from, the mounting surface 170a of external device 170. The active and inactive surfaces 111, 112 of semiconductor die 110, the third and fourth surfaces 131, 132 of substrate 130, and the first and second surfaces 151, 152 of encapsulant 150 are perpendicular to the mounting surface 170a of external device 130. Accordingly, the area of mounting surface 170 occupied by semiconductor package 100 is very small, which allows for a high mounting density. Further, the zigzag pattern of the solder balls 160 allows for the joints between the solder balls 160 and the mounting surface 170a to be in a zigzag pattern, which provides for a high strength connection between the semiconductor package 100 and the external device 170.

In an alternative embodiment, the ball lands 135 and solder balls 160 may be arranged in a single row, in aligned plural rows (i.e., not a zigzag pattern), or in three or more aligned or zigzag rows.

In an alternative embodiment, the vias 136 may be replaced by conductive circuit patterns that extend between the bond fingers 134 and ball lands 135 over third surface 131 and second surface 133b.

In an alternative embodiment, the bond pads 115 may be arranged differently than in semiconductor package 100, e.g., the bond pads 115 may be arranged in plural rows along side surface 113, or along side surface 113 and in a central region of the active surface 111, or even in a quad row arrangement along all four edges of active surface 111, although such arrangements would increase the length of the bond wires 140.

Figure 2A:
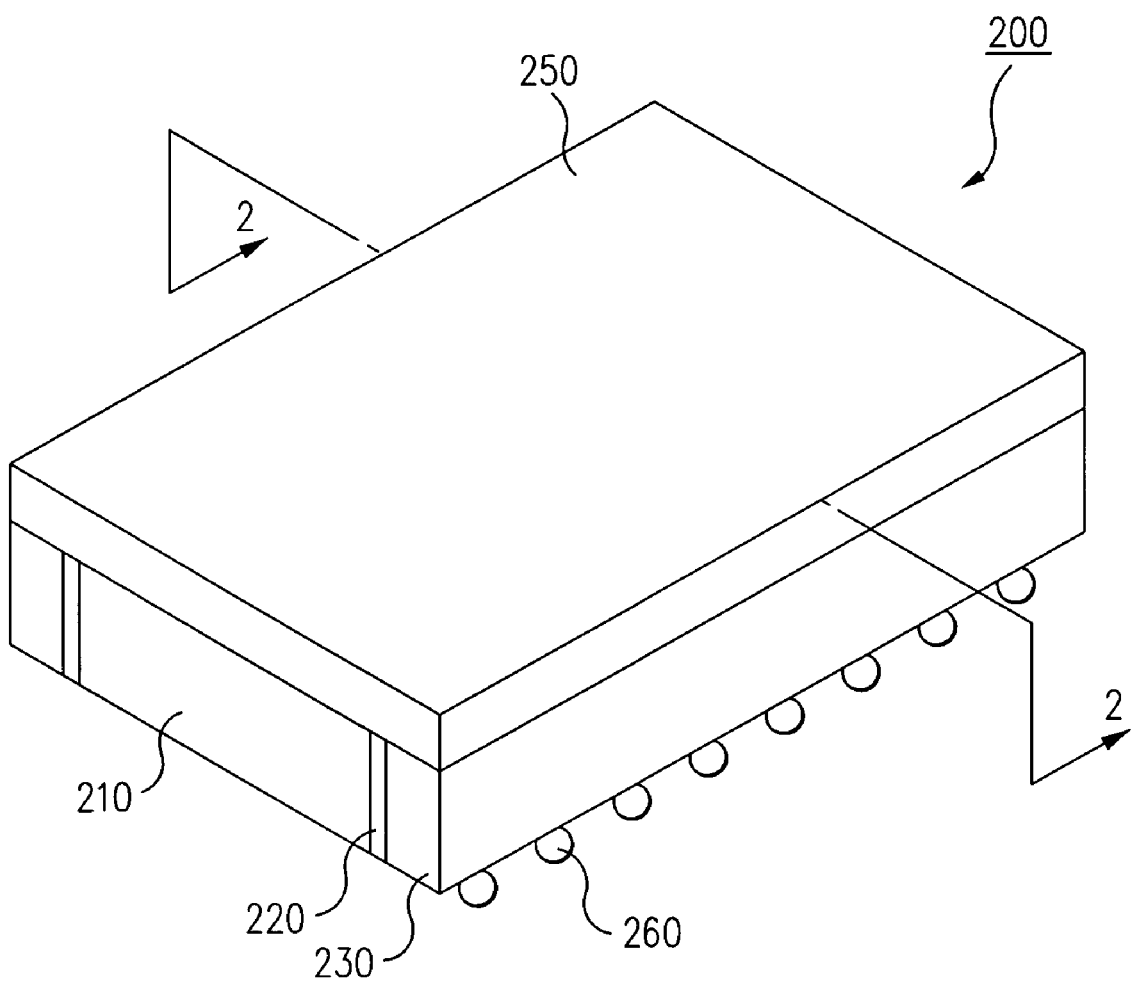
FIG. 2A is a perspective view of a semiconductor package according to another embodiment of the present invention.
Figure 2B:
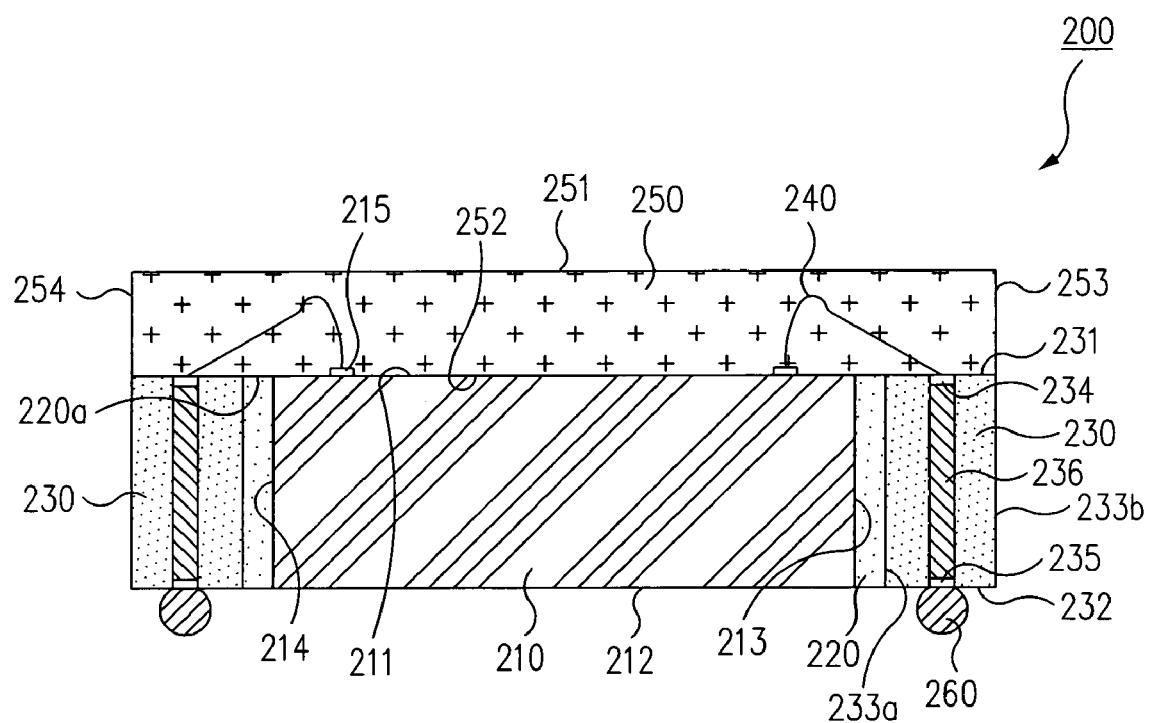
FIG. 2B is a cross-sectional side view taken along the line 2—2 of FIG. 2A.
Figure 2C:
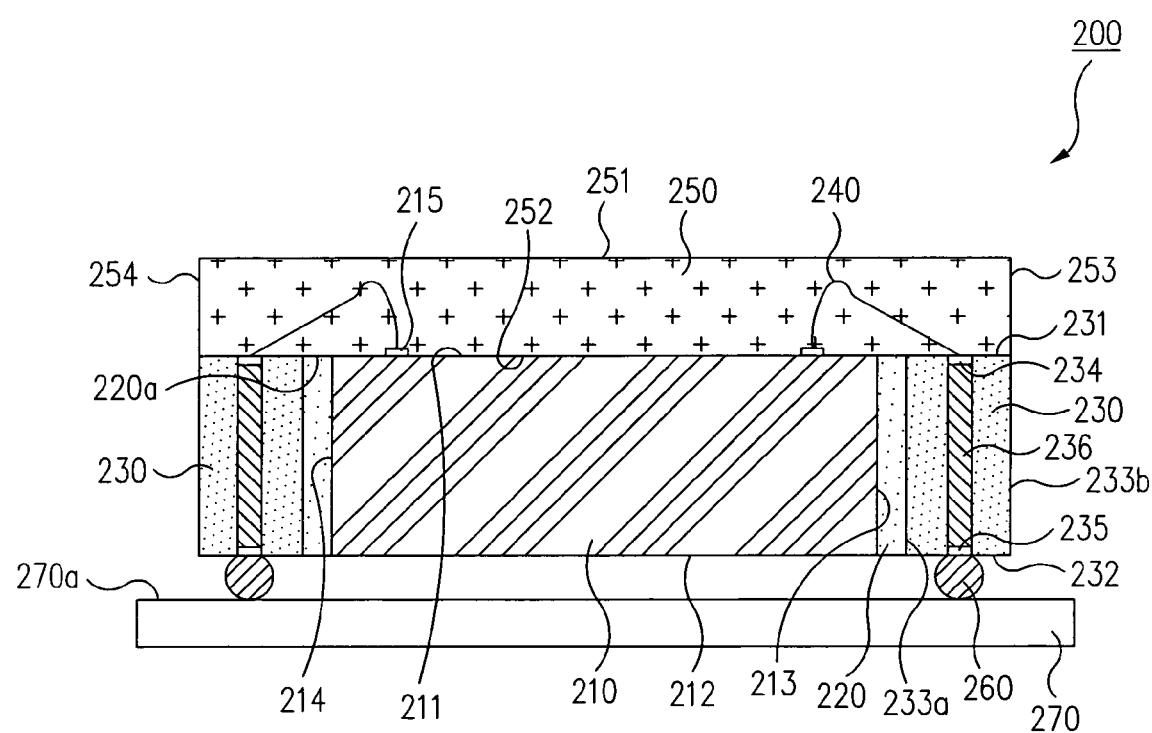
FIG. 2C is a perspective view of the semiconductor package of FIG. 2A mounted to an external device.

FIGS. 2A–2C show a semiconductor package 200 in accordance with another embodiment of the present invention. FIG. 2A is a perspective view of semiconductor package 200. FIG. 2B provides a sectional view taken along the line 2—2 of FIG. 2A. FIG. 2C shows the semiconductor package 200 mounted on an external device 270, e.g., a printed circuit board.

Referring to FIGS. 2A–2C, the semiconductor package 200 includes a semiconductor die 210, two layers of an insulative adhesive 220 each bonded on a respective one of the opposed parallel peripheral side surfaces 213, 214 of the semiconductor die 210, two substrates 230 each bonded to a respective one of the layers of adhesive 220 opposite the semiconductor die 210, a plurality of conductive wires 240 electrically coupling the semiconductor die 210 to the two substrates 230, an encapsulant 250 that covers the conductive wires 240 and the active surface 211 of the semiconductor die 210, an adjacent peripheral surface 220a of the each of the layers of adhesive 220, and a peripheral surface 232 of the each of the substrates 230, and a plurality of solder balls 260 fused to the substrates 230.

The semiconductor die 210 has the form of a rectangular prism, and includes a planar rectangular active surface 211 and a planar rectangular inactive surface 212 opposed to the active surface 211. The semiconductor die 210 further includes four rectangular planar peripheral side surfaces that are between and perpendicular to the active and inactive surfaces 211 and 212. Two of those four peripheral side surfaces, i.e., a side surface 213 and an opposite parallel side surface 214, are shown. The peripheral side surfaces 213, 214 were formed when the semiconductor die 210 was singulated from a semiconductor wafer. A plurality of bond pads 215 are formed at the active surface 211. In this example, the bond pads 215 are formed in two rows along opposed edges of active surface 211, with one row adjacent to each of the side surfaces 213, 214. Alternatively, the bond pads 215 may be arranged in four rows, with one row adjacent each of the four edges of active surface 211, i.e., quad type. The thickness of the semiconductor die 210, which is not back-grinded or otherwise thinned, is approximately 29 mils between the active and inactive surfaces 212, 212.

A first layer of the adhesive 220 is bonded to the side surface 213 of the semiconductor die 210, and covers the entirety of side surface 213, and a second layer of the adhesive 220 is bonded to the side surface 214 of the semiconductor die 210, and covers the entirety of side surface 214. A planar surface 220a of each adhesive layer 220 is coplanar with active surface 211. Here, the material of the adhesive 220 may be an adhesive tape, an epoxy, and the like.

Each of the two substrates 230 is bonded to a respective one of the adhesive layers 220. Each substrate 230 has the form of a rectangular prism, and includes a planar rectangular major first surface 233a that faces, is parallel to, and is coextensive with the respective adjacent side surface 213 or 214 of semiconductor die 210 and is coupled thereto by the adhesive 220, and a parallel planar rectangular major second surface 233b opposed to the first surface 233a. Each substrate 230 further includes four rectangular planar peripheral surfaces perpendicular to and between the first and second surfaces 233a, 233b. Two of those four peripheral side surfaces, i.e., a third surface 231 and an opposite parallel fourth surface 232, are shown. The third surface 231 of each substrate 230 is flush with (i.e., coplanar with) the active surface 211 of the semiconductor die 210 and with adhesive layer surface 220a, and the opposite fourth surface 232 of the substrate 230 is flush with the inactive surface 212 of the semiconductor die 210. The thickness of substrate 230 between first and second surfaces 233a, 233b is much less than the thickness of semiconductor die 210 between side surfaces 213, 214. Accordingly, the whole size of the semiconductor package 200 is close to that of the semiconductor die 210 alone.

Each substrate 230 includes an electrically insulative core, which may be formed of one or more layers of any suitable insulative material, such as polyimide, FR4, epoxy resin, ceramic, and the like. The substrate 230 further includes a plurality of electrically conductive circuit patterns at the surface of, and within, the core insulative layer of substrate 230, including a plurality of bond fingers 234 at third surface 231 and a plurality of ball lands 235 formed at the opposite fourth surface 232 thereof. Here, the ball lands 235 are formed in a single row on each of the substrates 230. A plurality of electrically conductive vias 236 extend straight through the insulative core of substrate 230 between third surface 231 and fourth surface 232. Each of the bond fingers 234 of each substrate 230 is electrically coupled to a respective one of the ball lands 235 by a respective one of the conductive vias 236. In an alternative embodiment, the vias 236 may be replaced with circuit patterns that extend between the bond fingers 234 and the ball lands 235 of the third and fourth surfaces 231, 232, respectively, over the second surface 233b of the substrate 230.

Each of the bond pads 215 of the semiconductor die 210 is electrically coupled to a respective one of the bond fingers 234 of the nearest one of the two substrates 230 by a respective one of a plurality of electrically conductive wires 240. Here, since the bond pads 215 are closely adjacent to one of the side surfaces 213, 214, the length of the conductive wires 240 is relatively short, thereby improving the electric efficiency of the semiconductor package 200. The material of the conductive wire 240 may be aluminum (Al), copper (Cu), gold (Au), silver (Ag) and the like. However, the present invention is not limited to any material of the conductive wire.

The active surface 211 of the semiconductor die 210, the bond pads 215, the conductive wires 240, the peripheral surface 220a of the adhesive layers 220, the third surface 231 of the substrates 230, and the bond fingers 234 of semiconductor package 200 are entirely covered by an electrically insulative encapsulant 250, which may be a hardened epoxy mold compound or a hardened liquid encapsulant. The encapsulant 250 includes a planar exposed first surface 251, and a planar unexposed second surface 252 that is opposite the first surface 251. The second surface 252 is formed on and bonded to the active surface 211, the peripheral surface 220a of each of the adhesive layers 220, and the third surface 231 of each substrate 230, all of which surfaces are coplanar. The encapsulant 250 also includes four rectangular planar peripheral surfaces that are between and perpendicular to the first and second surfaces 251, 252. Two of those four peripheral side surfaces of encapsulant 250, i.e., third surface 253 and parallel opposite fourth surface 254, are shown. The third surface 253 and the fourth surface 254 of the encapsulant 250 are flush with the second surfaces 233b of the substrates 230. Accordingly, the inactive surface 212 and two of the four peripheral side surfaces (see FIG. 1A) of the semiconductor die 210 (i.e., the two others besides side surfaces 213, 214) are exposed to the outside environment, which provides semiconductor package 200 with excellent heat radiation and a near-chip size.

On each of the substrates 230, each of a plurality of solder balls 260 is fused to a respective one of the ball lands 235 of the fourth surface 232 of the substrate 230.

Semiconductor package 200 is mounted on external device 270 of FIG. 2C by an electrical coupling of the solder balls 260 to corresponding circuit patterns of the external device 270. That is, the solder balls 260 are fused to the circuit patterns of the external device 270. Electrical signals pass between the semiconductor die 210 and circuit patterns of the external device 270 through the bond pads 215, the conductive wires 240, the bond fingers 234, the electrically conductive vias 236, the ball lands 235, and the solder balls 260.

In the mounting of FIG. 2C, the semiconductor package 200 is mounted so that inactive surface 212 of semiconductor die 210, and fourth surface 232 of the substrates 230 face and are parallel to the mounting surface 270a of external device 270. Accordingly, the area of mounting surface 270a occupied by semiconductor package 200 is very small, which allows for a high mounting density. In an alternative embodiment, the ball lands 235 and solder balls 260 may be arranged in a plural rows on each substrate 230.

Figure 3A:
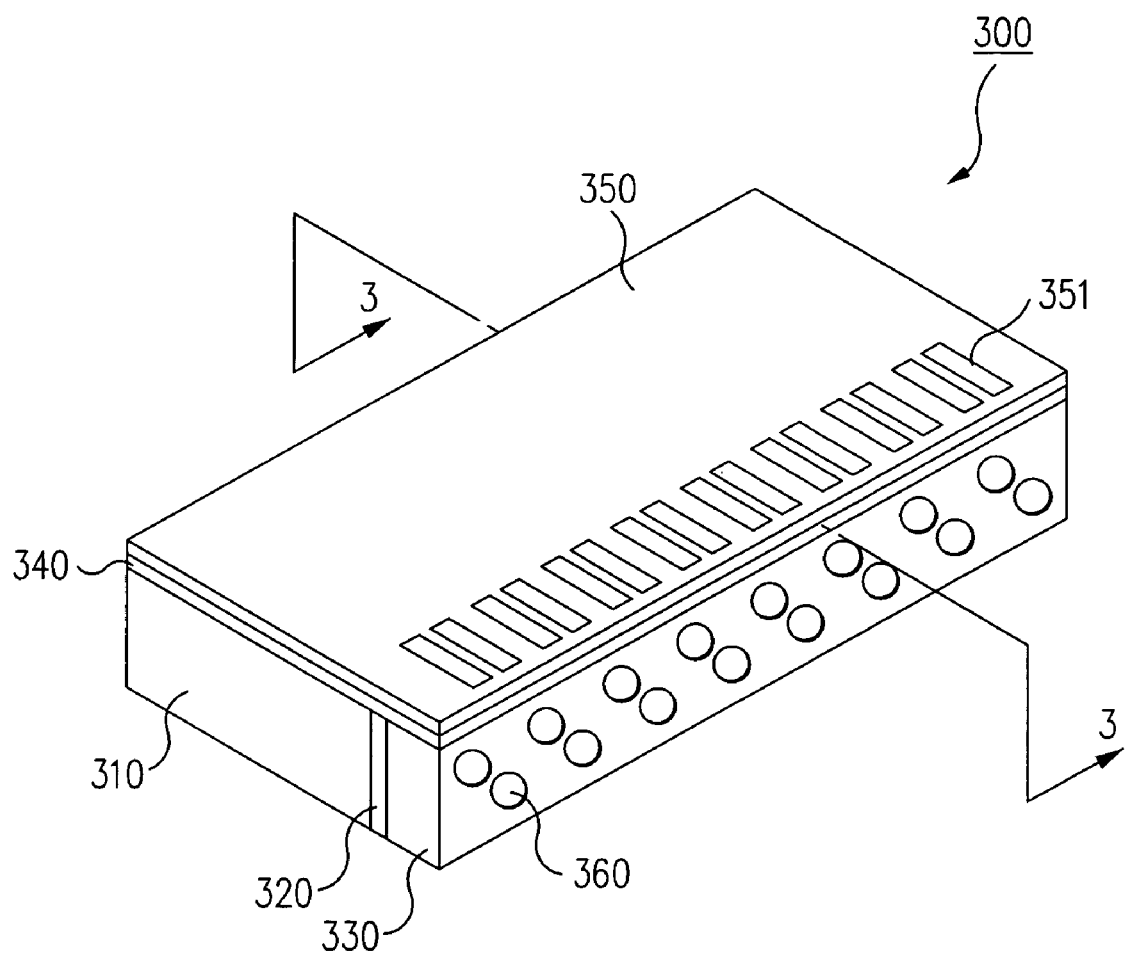
FIG. 3A is a perspective view of a semiconductor package according to another embodiment of the present invention.
Figure 3B:
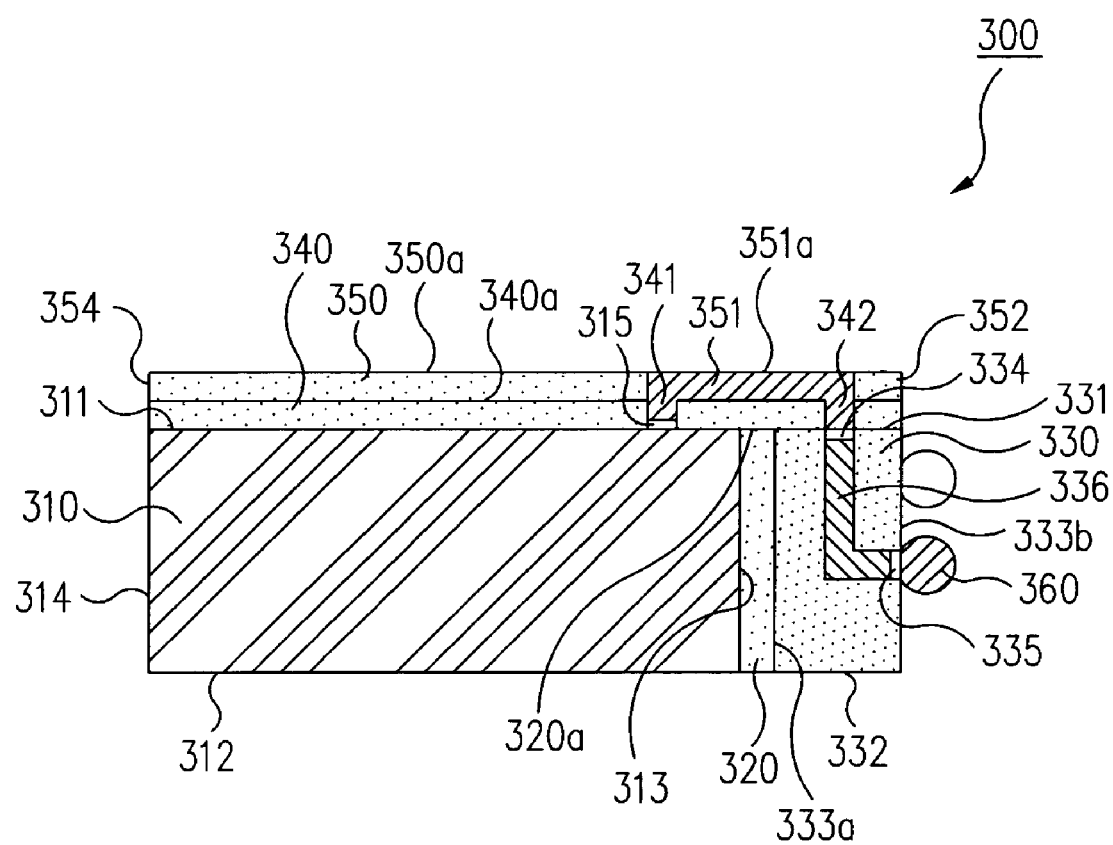
FIG. 3B is a cross-sectional side view taken along the line 3—3 of FIG. 3A.
Figure 3C:
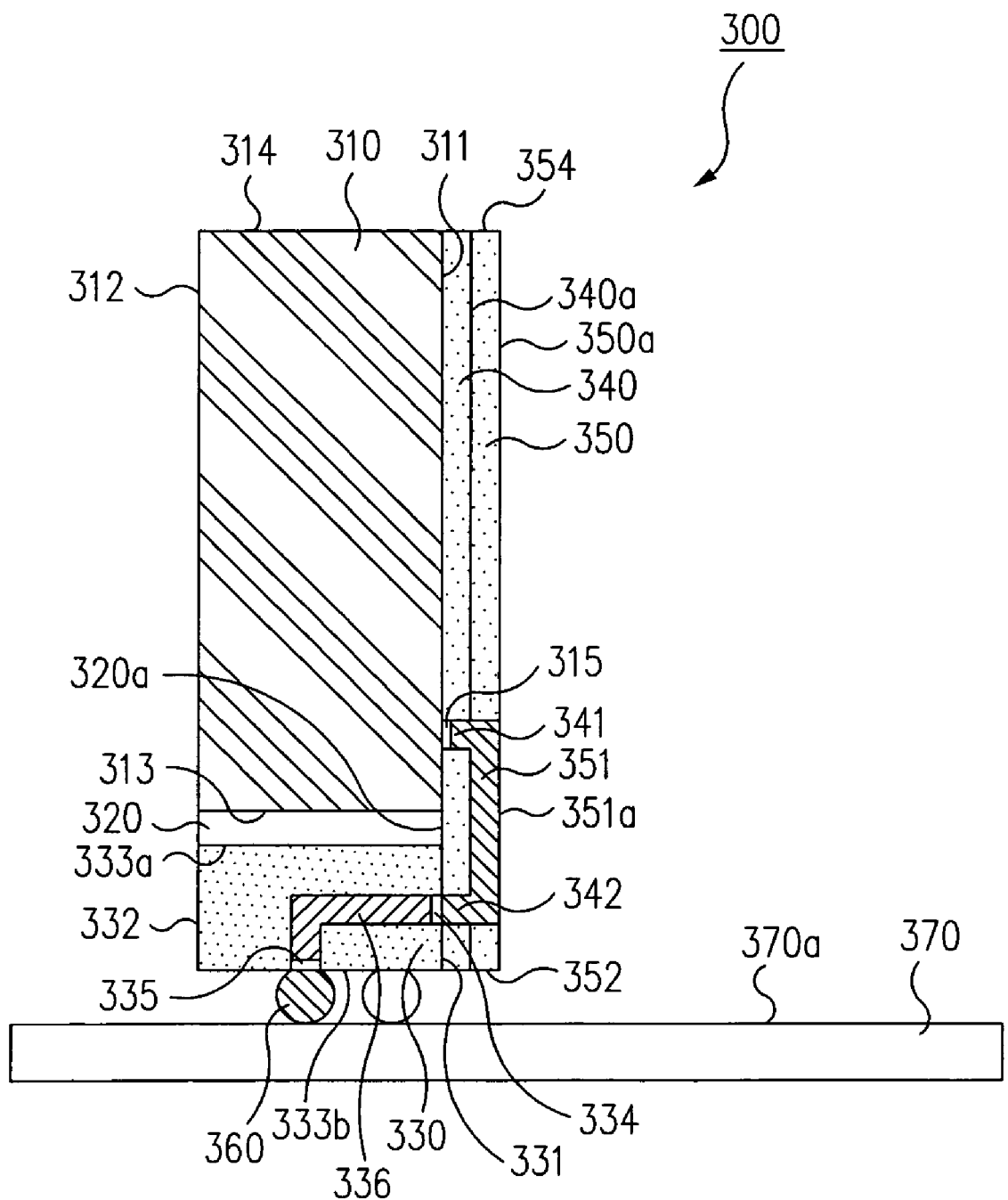
FIG. 3C is a perspective view showing the semiconductor package of FIG. 3A mounted to an external device.

FIG. 3A shows a semiconductor package 300 that includes a substrate 330 that is coupled to one of the four planar peripheral side surfaces of the packaged semiconductor die 310. FIG. 3B provides a sectional view taken along the line 3—3 of FIG. 3A. FIG. 3C shows the semiconductor package 300 mounted on an external device 370, e.g., a printed circuit board.

Referring to FIGS. 3A–3C, the semiconductor package 300 includes a semiconductor die 310, a layer of an insulative adhesive 320 bonded on a peripheral side 313 of the semiconductor die 310, a substrate 330 bonded to the adhesive 320 opposite semiconductor die 310, two insulative layers 340, 350 that successively overlie the active surface 311 of semiconductor die 310 and that include conductive circuit patterns that electrically couple the semiconductor die 310 to the substrate 330, and a plurality of solder balls 360 fused to a peripheral surface 333b of the substrate 330.

The semiconductor die 310 has the form of a rectangular prism, and includes an active surface 311 and an inactive surface 312 opposed to the active surface 311. The semiconductor die 310 further includes four planar rectangular peripheral side surfaces that are between and perpendicular to the active and inactive surfaces 311 and 312. Two of those four peripheral side surfaces, i.e., a third surface 313 and an opposite parallel fourth surface 314, are shown. A plurality of bond pads 315 are formed at the active surface 311 of semiconductor die 310. In this example, the bond pads 315 are arranged in a single row that is adjacent to the side surface 313. There are no corresponding bond pads 315 along side surface 314. The thickness of the semiconductor die 310, which is not back-grinded or otherwise thinned, is approximately 29 mils between the active and inactive surfaces 311, 312.

The layer of adhesive 320 is bonded to the side surface 313 of the semiconductor die 310, and covers the entirety of side surface 313. A planar peripheral surface 320a of the adhesive layer 320 is coplanar with active surface 311. Here, the material of the adhesive 320 may be an adhesive tape, an epoxy and the like.

The substrate 330 is bonded to the adhesive 320. The substrate 330 has the form of a rectangular prism, and includes a rectangular major first surface 333a that faces side surface 313 of semiconductor die 310 and is coupled thereto by adhesive 320, a rectangular major second surface 333b opposed to the first surface 333a, and four rectangular planar peripheral surfaces that are perpendicular to and between the first and second surfaces 333a, 333b. Two of the four peripheral side surfaces, i.e., a third surface 331 and an opposite parallel fourth surface 332, are shown. First and second surfaces 333a, 333b of substrate 330 have the same, or approximately the same, area as side surface 313 of semiconductor die 310. First surface 333a is entirely covered by the adhesive layer 320. The third surface 331 of the substrate 330 is flush with (i.e., coplanar with) the active surface 311 of the semiconductor die 310, and the fourth surface 332 of the substrate 330 is flush with the inactive surface 312 of the semiconductor die 310. The thickness of substrate 330 between first and second surfaces 333a, 333b is much less than the thickness of semiconductor die 310 between side surfaces 313, 314. Accordingly, the whole size of the semiconductor package 300 is close to that of the semiconductor die 310 alone.

The substrate 330 includes an electrically insulative core, which may be formed of one or more layers of any suitable insulative material, such as polyimide, epoxy resin, FR4, ceramic, and the like. The substrate 330 further includes a plurality of electrically conductive circuit patterns at the surface of, and within, the core insulative layer of substrate 330, including a plurality of bond fingers 334 at third surface 331 and a plurality of ball lands 335 formed at the second surface 333b thereof. Here, the ball lands 335 are formed at the second surface 333b in two parallel rows. The ball lands 335 of the two rows alternate, with each ball land 335 of one row (except at the ends) being between two ball lands 335 of the other row, so that the two rows of ball lands 335 form a zigzag pattern. A plurality of electrically conductive vias 336 extend through the insulative core of substrate 330 between third surface 331 and second surface 333b. Each of the bond fingers 334 is electrically coupled to a respective one of the ball lands 335 by a respective one of the conductive vias 336. The conductive vias 336 each include a right angle bend or joint between a first portion extending perpendicularly inward from bond finger 334 and third surface 331 parallel to first and second surfaces 333a, 333b, and a second portion that extends inward perpendicularly inward from second surface 333b and the ball land 335. In an alternative embodiment, the vias 336 may be replaced by circuit patterns that extend between bond fingers 334 and lands 335 over third surface 331 and second surface 333b.

The active surface 311 of the semiconductor die 310, the bond pads 315, the planar surface 320a of adhesive layer 320, the third surface 331 of the substrate 330, and the bond fingers 334 are entirely covered by a protective electrically-interconnective structure that, in this example, is formed by successive layers 340, 350 of an electrically insulative material (e.g., polyimide, ceramic, epoxy resin) through which and/or on which electrically conductive circuit patterns 341, 342, and 351 extend.

A first insulating layer 340 contacts, is bonded to, and covers the active surface 311 of the semiconductor die 310, adhesive layer surface 320a, and the third surface 331 of the substrate 330, all of which surfaces are coplanar. The first insulating layer 340 includes a plurality of parallel conductive circuit patterns 341 and 342 that extend through the first insulating layer 340 in a direction perpendicular to the active surface 311 of semiconductor die 310 and the long dimension of the layers 340, 350. Each of the conductive circuit patterns 341 is disposed so that one of its ends faces a respective one of the bond pads 315 of semiconductor die 310. The particular end of the conductive circuit pattern 341 is electrically coupled to the juxtaposed bond pad 315. Similarly, each of the conductive circuit patterns 342 is disposed so that one of its ends faces a respective one of the bond fingers 334 of substrate 330. The particular end of the conductive circuit pattern 342 is electrically coupled to the juxtaposed bond finger 334.

The second insulating layer 350 contacts, is bonded to, and covers the first insulating layer 340 opposite the active surface 311. The second insulating layer 350 includes a plurality of conductive circuit patterns 351 that extend through second insulating layer 350 in a direction parallel to active surface 311 and to the long dimension of layers 340, 350, and perpendicular to conductive circuit patterns 341, 342. Each conductive circuit pattern 351 extends between and electrically couples one of the conductive circuit patterns 341 and one of the conductive circuit patterns 342. Accordingly, the bond pads 315 of the semiconductor die 310 and the bond fingers 334 of the substrate 330 are electrically coupled to each other by means of the first conductive circuit patterns 341 and 342 and the second conductive circuit patterns 351. A surface 351a of each of the conductive circuit patterns 351 is exposed at the outer exposed surface 350a of the second insulating layer 350.

The first and second insulating layers 340, 350 are rectangular in area, and successively cover the active surface 311 of semiconductor die 310, the adhesive layer surface 320a, and the third surface 331 of substrate 330, all of which surfaces are coplanar. The first and second insulating layers include rectangular major peripheral surfaces 340a, 350a, respectively. The four peripheral side surfaces of first and second insulating layers 340, 350 that extend perpendicularly between major surface 350a of second layer 350 and active surface 311, of which two parallel opposed side surfaces 352, 354 are shown, are flush with, i.e., coplanar with, the corresponding peripheral sides of semiconductor die 310 or substrate 330, e.g., side surface 354 is flush with side surface 314 of semiconductor die 310 and side surface 352 is flush with second surface 333b of substrate 330.

The first and second insulating layers 340, 350 may be applied through a screen printing process, or may be preformed and attached to each other and to semiconductor die 310 and substrate 330 with an adhesive layer. The first conductive circuit patterns 341 and 342 and the second conductive circuit patterns 351 may be formed by screen printing or filling any one of gold (Au), silver (Ag) and solder (Sn/Pb) on and/or through the first and second insulating layers 340 and 350.

Accordingly, the inactive surface 312, and three of the four peripheral side surfaces of the semiconductor die 310 (i.e., the side surface 314, and the two unshown parallel peripheral side surfaces) are exposed to the outside environment, which provides semiconductor package 300 with excellent heat radiation and a near-chip size.

Each of the plurality of solder balls 360 is fused to a respective one of the ball lands 335 of second surface 333b of substrate 330. Since the ball lands 335 are arranged in a zigzag pattern, the solder balls 360 are also form a zigzag pattern.

Semiconductor package 300 is mounted on external device 370 of FIG. 3C by an electrical coupling of the solder balls 360 to corresponding circuit patterns of the external device 370. That is, the solder balls 360 are fused to the circuit patterns of the external device 370. Electrical signals pass between the semiconductor die 310 and circuit patterns of the external device 370 through the bond pads 315, the conductive circuit patterns 341, 351, and 342, the bond fingers 334, the electrically conductive vias 336, the ball lands 335, and the solder balls 360.

In the mounting of FIG. 3C, the semiconductor package 300 is mounted so that side surface 313 of semiconductor die 310, second surface 333b of substrate 330, and side surface 352 of first and second insulating layers 340, 350 are parallel to and face the mounting surface 370a of external device 370. Side surface 314 of semiconductor die 310 and side surface 354 of of first and second insulating layers 340, 350 are parallel to, but face away from, the mounting surface 370a of external device 370. The active and inactive surfaces 311, 312 of semiconductor die 310, the third and fourth surfaces 331, 332 of substrate 330, and the long dimension of first and second insulating layers 340, 350 are perpendicular to the mounting surface 370a of external device 330. Accordingly, the area of mounting surface 370a occupied by semiconductor package 300 is very small, which allows for a high mounting density. Further, the zigzag pattern of the solder balls 360 allows for the joints between the solder balls 360 and the mounting surface 370a to be in a zigzag pattern, which provides for a high strength connection between the semiconductor package 300 and the external device 370.

In an alternative embodiment, the ball lands 335 and solder balls 360 may be arranged in a single row, in aligned plural rows (i.e., not a zigzag pattern), or in three or more aligned or zigzag rows.

In a further alternative embodiment, the exposed major surface of the second insulating layer 350 may be entirely overlaid by a third insulating layer, e.g., a tape or a solder mask, so that the surface 351a of each of the conductive circuit patterns 351 is covered by the third insulating layer.

Figure 3D:
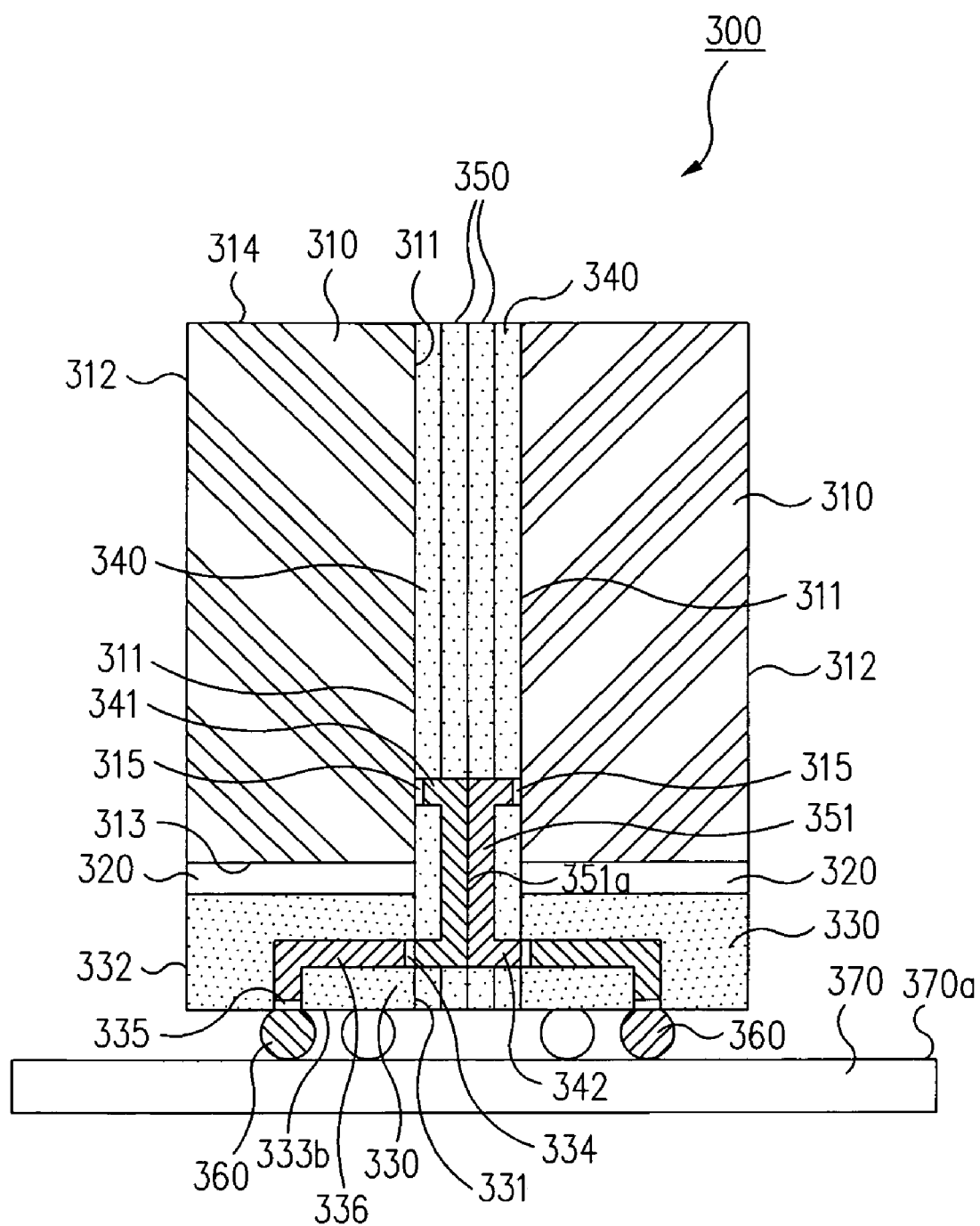
FIG. 3D is a cross-sectional side view of an alternative mounting for the semiconductor package of FIGS. 3A–3C.

FIG. 3D shows an alternative mounting for the semiconductor package 300 of FIGS. 3A–3C. In FIG. 3D, two semiconductor packages 300 are mounted on external device 370 adjacent to one another so that their respective active surfaces 311 and exterior surfaces 350a of their respective second insulating layers 350 face each other. The two packages 300 are electrically coupled together by a solder material or another electrically conductive connective material that is attached between the juxtaposed surfaces 351a of the facing conductive circuit patterns 351 of the two packages.

Figure 4A:
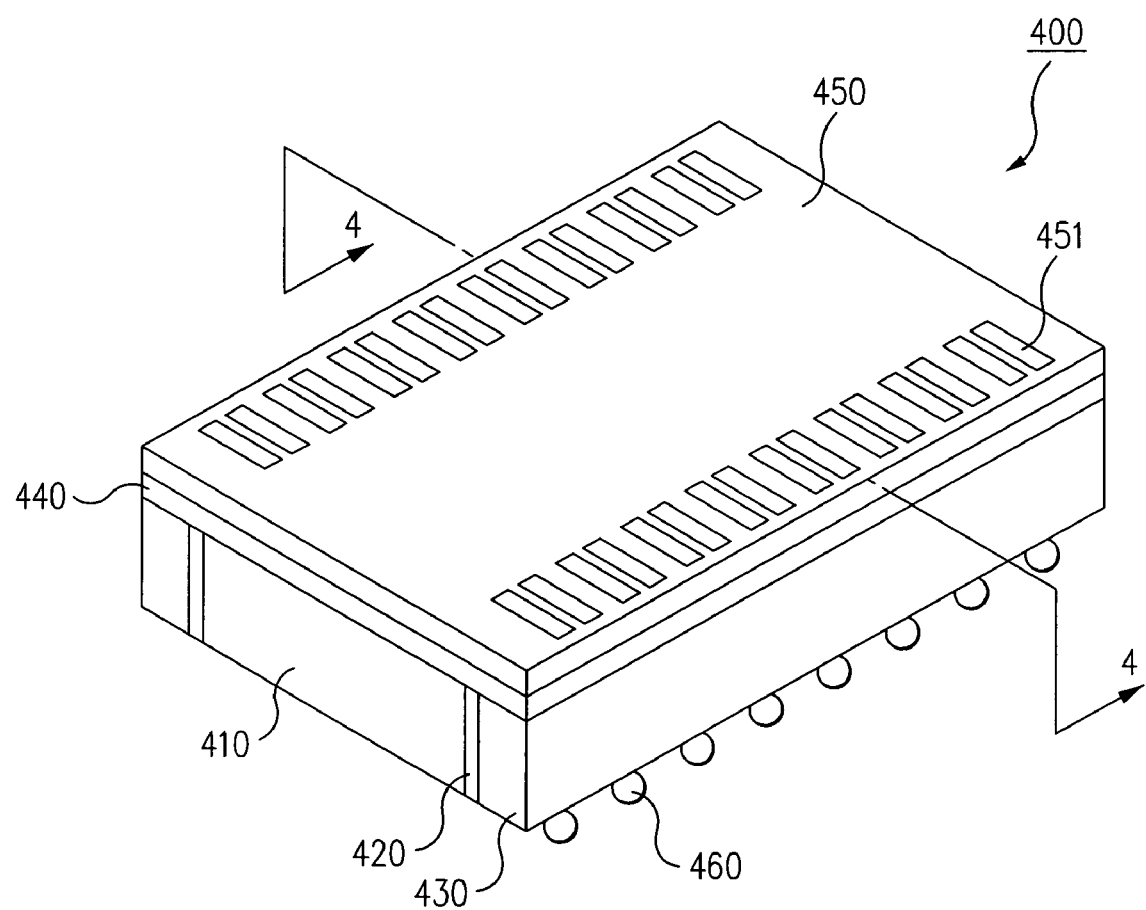
FIG. 4A is a perspective view of a semiconductor package according to another embodiment of the present invention.
Figure 4B:
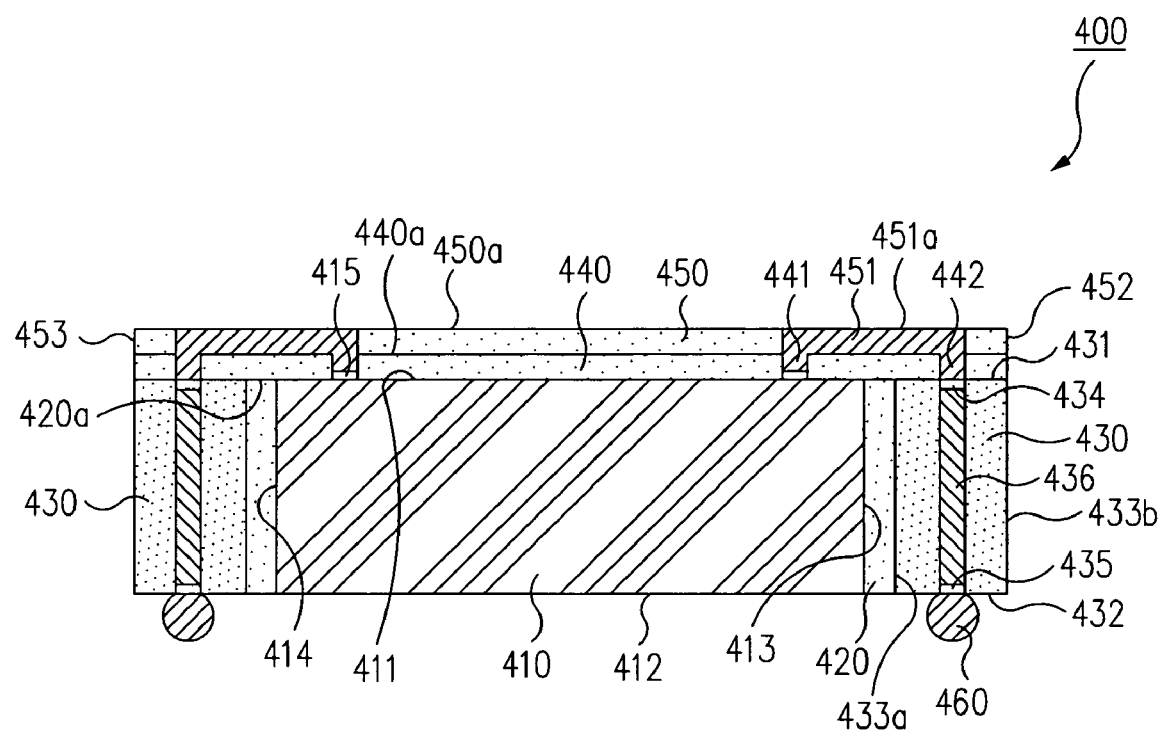
FIG. 4B is a cross-sectional side view taken along the line 4—4 of FIG. 4A.
Figure 4C:
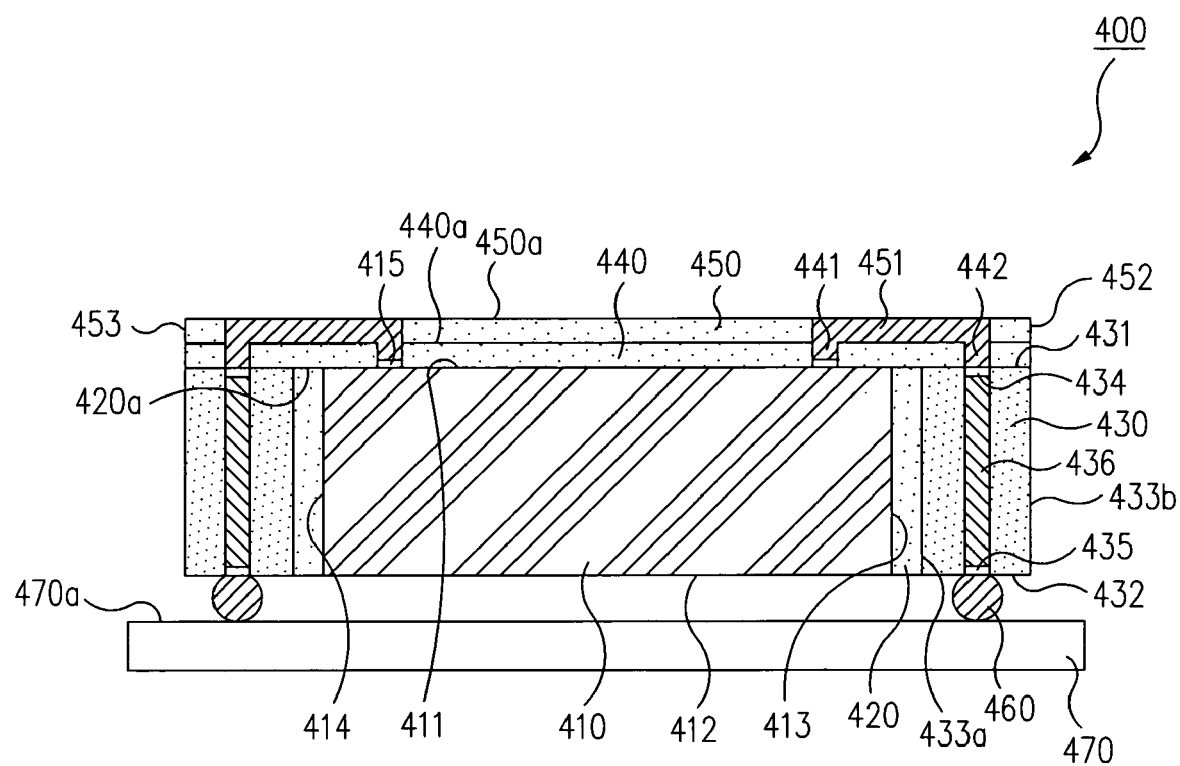
FIG. 4C is a cross-sectional side view showing the semiconductor package of FIG. 4A mounted to an external device.

FIGS. 4A–4C show a semiconductor package 400 in accordance with another embodiment of the present invention. FIG. 4A is a perspective view of semiconductor package 400. FIG. 4B provides a sectional view taken along the line 4—4 of FIG. 4A. FIG. 4C shows the semiconductor package 400 mounted on an external device 470, e.g., a printed circuit board.

Referring to FIGS. 4A–4C, the semiconductor package 400 includes a semiconductor die 410, two layers of an adhesive 420 each bonded on a respective one of the opposed parallel peripheral sides 413, 414 of the semiconductor die 410, two substrates 430 each bonded to a respective one of the layers of adhesive 420 opposite the semiconductor die 410, two insulative layers 440, 450 that successively overlie the active surface 411 of semiconductor die 410 and that include conductive circuit patterns 441, 451, and 442, and a plurality of solder balls 460 fused to each of the two substrates 430.

The semiconductor die 410 has the form of a rectangular prism, and includes a planar rectangular active surface 411 and a planar rectangular inactive surface 412 opposed to the active surface 411. The semiconductor die 410 further includes four rectangular planar peripheral side surfaces that are between and perpendicular to the active and inactive surfaces 411 and 412. Two of those four peripheral side surfaces, i.e., a side surface 413 and an opposite parallel side surface 414, are shown. The peripheral side surfaces 413, 414 were formed when the semiconductor die 410 was singulated from a semiconductor wafer. A plurality of bond pads 415 are formed at the active surface 411. In this example, the bond pads 415 are formed in two rows along opposed edges of active surface 411, with one row adjacent to each of the side surfaces 413, 414. Alternatively, the bond pads 445 may be arranged in four rows, with one row adjacent each of the four edges of active surface 411, i.e., a quad type semiconductor die. The thickness of the semiconductor die 410, which is not back-grinded or otherwise thinned, is approximately 29 mils between the active and inactive surfaces 411, 412.

A first layer of the adhesive 420 is bonded to the side surface 413 of the semiconductor die 410, and covers the entirety of side surface 413, and a second layer of the adhesive 420 is bonded to the opposite side surface 414 of the semiconductor die 410, and covers the entirety of side surface 414. A planar peripheral surface 420a of each of the adhesive layers 420 is coplanar with active surface 411. Here, the material of the adhesive 420 may be an adhesive tape, an epoxy and the like.

Each of the two substrates 430 is bonded to a respective one of the adhesive layers 420. The substrate 430 has the form of a rectangular prism, and includes a rectangular major first surface 433a that faces, is parallel to, and coextensive with the respective adjacent side surface 413, 414 of semiconductor die 410 and is coupled thereto by the adhesive 420, a rectangular major second surface 433b parallel to and opposed to the first surface 433a, and four planar peripheral surfaces perpendicular to and between the first and second surfaces 433a, 433b. Two of the four peripheral surfaces, a third surface 431 and an opposite parallel fourth surface 432, are shown. The third surface 431 of the substrate 430 is flush with (i.e., coplanar with) the active surface 411 of the semiconductor die 410, and the opposite fourth surface 432 of the substrate 430 is flush with the inactive surface 412 of the semiconductor die 410. The thickness of substrate 430 between first and second surfaces 433a, 433b is much less than the thickness of semiconductor die 410 between side surfaces 413, 414. Accordingly, the whole size of the semiconductor package 400 is close to that of the semiconductor die 410 alone.

Each substrate 430 includes an electrically insulative core, which may be formed of one or more layers of any suitable insulative material, such as polyimide, FR4, epoxy resin, ceramic, and the like. The substrate 430 further includes a plurality of electrically conductive circuit patterns at the surface of, and within, the core insulative layer of substrate 430, including a plurality of bond fingers 434 at the third surface 431 and a plurality of ball lands 435 at the opposite fourth surface 432 thereof. Here, the ball lands 435 are formed in a single row on each of the substrates 430. A plurality of electrically conductive vias 436 extend straight through the insulative core of substrate 430 between the third surface 431 and the fourth surface 432. Each of the bond fingers 434 of each substrate 430 is electrically coupled to a respective one of the to the ball lands 435 by a respective one of the conductive vias 436.

The active surface 411 of the semiconductor die 410, the bond pads 415, the peripheral surface 420a of the adhesive layers 420, the third surface 431 of the substrates 430, and the bond fingers 434 are entirely covered by a protective electrically interconnective structure that, in this example, is formed by successive layers 440, 450 of an electrically insulative material (e.g., polyimide, ceramic, epoxy resin) through which and/or on which electrically conductive circuit patterns 441, 442, and 451 extend.

The first insulating layer 440 contacts, is bonded to and covers the active surface 411 of the semiconductor die 410, the adhesive layer surfaces 420a, and the third surface 431 of the substrates 430, all of which surfaces are coplanar. The first insulating layer 440 includes a plurality of parallel conductive circuit patterns 441 and 442 that extend through the first insulating layer 440 in a direction perpendicular to the active surface 411 of semiconductor die 410 and to the long dimension of layers 440, 450. Each of the conductive circuit patterns 441 is disposed so that one of its ends faces a respective one of the bond pads 415 of semiconductor die 410. The particular end of the conductive pattern 441 is electrically coupled to the juxtaposed bond pad 415. Similarly, each of the conductive circuit patterns 442 is disposed so that one of its ends faces a respective one of the bond fingers 434 of substrate 430. The particular end of the conductive pattern 442 is electrically coupled to the juxtaposed bond finger 434.

The second insulating layer 450 contacts, is bonded to, and covers the first insulating layer 440 opposite the active surface 411. The second insulating layer 450 includes a plurality of conductive circuit patterns 451 that extend through second insulating layer 450 in a direction parallel to the active surface 411 and to the long dimension of layers 440, 450, and perpendicular to conductive circuit patterns 441, 442. Each conductive pattern 451 extends between and electrically couples one of the conductive circuit patterns 441 and one of the conductive circuit patterns 442. Accordingly, the bond pads 415 of the semiconductor die 410 and the bond fingers 434 of the substrate 430 are electrically connected to each other by means of the first conductive circuit patterns 441 and 442 and the intervening second conductive circuit patterns 451. A surface 451a of each of the conductive circuit patterns 451 is exposed at the outer exposed surface 450a of the second insulating layer 450.

The major surfaces 440a, 450a of the first and second insulating layers 440, 450, respectively, are rectangular in area, and are parallel to the active surface 411 of semiconductor die 410 and third surface 431 of substrate 430. The four peripheral side surfaces of the first and second insulating layers 440, 450, of which two opposed parallel side surfaces 452, 453 are shown, are flush with, i.e., coplanar with the corresponding peripheral surfaces of the semiconductor die 410 or substrate 430, e.g., side surface 452 and side surface 453 are flush with second surfaces 433b of substrates 430.

The first and second insulating layers 440, 450 may be applied through a screen printing process, or may be preformed and attached to each other and to semiconductor die 410 and substrates 430 with an adhesive layer. The first conductive circuit patterns 441 and 442 and the second conductive circuit patterns 451 may be formed by filling any one of gold (Au), silver (Ag) and solder (Sn/Pb) on and/or through the first and second insulating layers 440 and 450.

On each of the substrates 430, a plurality of solder balls 460 is fused to the ball lands 435 of the fourth surface 432 of each of the two substrates 430.

Semiconductor package 400 is mounted on external device 470 of FIG. 4C by an electrical coupling of the solder balls 460 to corresponding circuit patterns of the external device 470. That is, the solder balls 460 are fused to the circuit patterns of the external device 470. Electrical signals pass between the semiconductor die 410 and circuit patterns of the external device 470 through the bond pads 415, the conductive circuit patterns 441, 451, and 442, the bond fingers 434, the electrically conductive vias 436, the ball lands 435, and the solder balls 460.

In the mounting of FIG. 4C, the semiconductor package 400 is mounted so that the inactive surface 412 of semiconductor die 410, and the second surface 432 of the substrates 430 face and are parallel to the mounting surface 470a of external device 470. Accordingly, the area of mounting surface 470a occupied by semiconductor package 400 is small, which allows for a high mounting density.

In an alternative embodiment, the ball lands 435 and solder balls 460 may be arranged in a plural rows on each substrate 430.

In a further alternative embodiment, the exposed major surface 450a of the second insulating layer 450 may be entirely overlaid by a third insulating layer, e.g., a polyimide layer or a plastic tape or a solder mask, so that the surface 451a of conductive circuit patterns 451 is covered by the third insulating layer.

In a further alternative embodiment, the vias 436 may be replaced with circuit patterns that extend between the bond fingers 434 and the ball lands 435 of the third and fourth surfaces 431, 432, respectively, over the second surface 433b of the substrate 430.

Figure 4D:
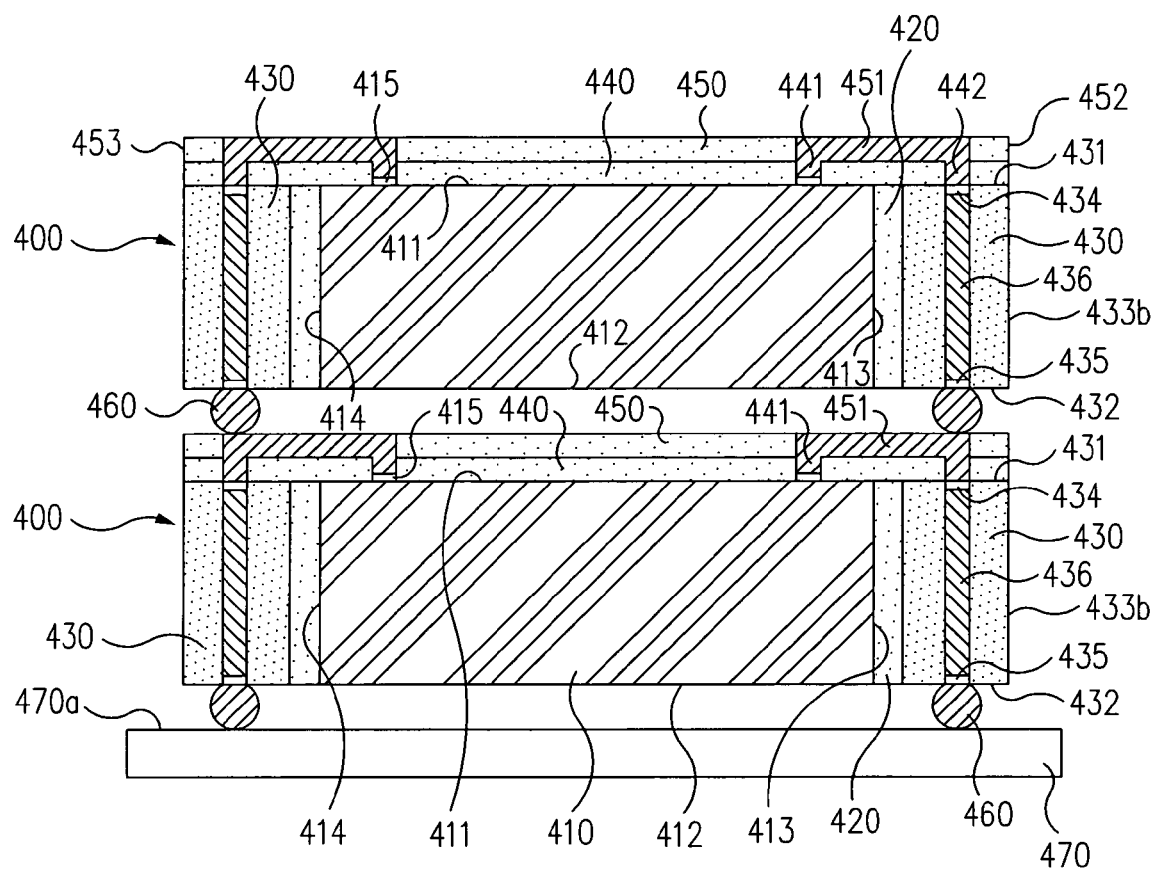
FIG. 4D is a perspective view of an alternative mounting for the semiconductor package of FIGS. 4A–4C.

FIG. 4D shows an alternative mounting for the semiconductor package 400 of FIGS. 4A–4C. A first semiconductor package 400 is stacked on a second semiconductor package 400 so that the solder balls 460 of the first semiconductor package are juxtaposed with, and electrically coupled to, the exposed surface 451a of the conductive circuit patterns 451 of the second semiconductor package 400.

This disclosure provides exemplary embodiments of the present invention. The scope of the present invention is not limited by these exemplary embodiments. Numerous variations, whether explicitly provided for or implied by the specification, such as variations in structure, dimension, type of material and the manufacturing process may be implemented by one who is skilled in the art, in view of this disclosure.

What is claimed is:

1. A semiconductor package comprising:
   a semiconductor die comprising an active surface with bond pads thereon, an opposite inactive surface, and four peripheral side surfaces extending between the active and inactive surfaces;
   a substrate comprising a first surface, a second surface opposite and parallel to the first surface, a third surface extending between the first and second surfaces, and conductive circuit patterns at the second and third surfaces,
   wherein the first surface of the substrate is coupled to only a first one of the four peripheral side surfaces of the semiconductor die, the third surface of the substrate is coplanar with the active surface of the semiconductor die, and the bond pads of the semiconductor die are electrically coupled to the conductive circuit patterns of the third surface of the substrate; and external interconnects electrically coupled to the circuit patterns of the second surface of the substrate, whereby at least some of the external interconnects are electrically coupled to the semiconductor die.

2. The semiconductor package of claim 1, wherein the circuit patterns of the second surface of the substrate include ball lands, and the external interconnects are solder balls.

3. The semiconductor package of claim 1, wherein the circuit patterns of the third surface of the substrate include bond fingers, and the bond pads of the semiconductor die are electrically coupled to the bond fingers by conductive wires.

4. The semiconductor package of claim 3, further comprising an insulative encapsulant covering the active surface of the semiconductor die, the conductive wires, and the third surface of the substrate.

5. The semiconductor package of claim 4, wherein the encapsulant includes opposed parallel first and second surfaces, with the first surface being coplanar with a second of the side surfaces of the semiconductor die that is opposite to the first side surface of the semiconductor die, and with the second surface of the encapsulant being coplanar with the second surface of the substrate.

6. The semiconductor package of claim 1, wherein the circuit patterns of the second surface of the substrate are electrically coupled to the circuit patterns of the third surface of the substrate by vias extending through an insulative core of the substrate between the second and third surfaces.

7. The semiconductor package of claim 1, wherein the circuit patterns of the second surface of the substrate are electrically coupled to the circuit patterns of the third surface of the substrate by circuit patterns extending over the second and third surfaces of the substrate.

8. The semiconductor package of claim 1, further comprising a first insulating layer covering the active surface of the semiconductor die and the third surface of the substrate, a second insulating layer covering the first insulating layer, and conductive first circuit patterns extending through the first and second insulating layers, wherein the bond pads of the semiconductor die are electrically coupled to the circuit patterns of the third surface of the substrate through the first circuit patterns.

9. The semiconductor package of claim 8, wherein a surface of the first circuit patterns is exposed through an outer surface of the second insulating layer.

10. The semiconductor package of claim 1, wherein the active surface of the semiconductor die and the third surface of the substrate are together covered by a layer of an insulating material, and the inactive surface and the remaining three of the four side surfaces of the semiconductor die are exposed.

11. A semiconductor package comprising:

a semiconductor die comprising an active surface with bond pads thereon, an opposite inactive surface, and four peripheral side surfaces extending between the active and inactive surfaces;

first and second substrates each comprising a first surface, a second surface opposite and parallel to the first surface, a third surface extending between the first and second surfaces, and conductive circuit patterns at the first and second surfaces, wherein the third surface of the first substrate is coupled only to a first of the four side surfaces of the semiconductor die, the third surface of the second substrate is coupled only to a second of the four side surfaces of the semiconductor die, the second side surface being opposite to the first side surface, and the first surface of each of the two substrates is coplanar with the active surface of the semiconductor die, wherein the circuit patterns of the first surface of the first and second substrates are electrically coupled to the circuit patterns of the second surface of the respective substrate, and wherein some of the bond pads of the semiconductor die are electrically coupled to the circuit patterns of the first surface of the first substrate, and some of the bond pads of the semiconductor die are electrically coupled to the circuit patterns of the first surface of the second substrate; and external interconnects electrically coupled to the circuit patterns of the second surface of the first and second substrates, whereby the external interconnects of the first and second substrates are electrically coupled to the semiconductor die.

12. The semiconductor package of claim 11, wherein the circuit patterns of the second surface of the first and second substrates include ball lands, and the external interconnects are solder balls.

13. The semiconductor package of claim 11, wherein the circuit patterns of the first surface of the first and second substrates include bond fingers, and the bond pads of the semiconductor die are electrically coupled to the bond fingers of the first and second substrates by conductive wires.

14. The semiconductor package of claim 13, further comprising an insulative encapsulant covering the active surface of the semiconductor die, the conductive wires, and the first surface of the first and second substrates.

15. The semiconductor package of claim 11, wherein the circuit patterns of the first surface of the first and second substrates are electrically coupled to the circuit patterns of the second surface of the respective substrate by vias extending through an insulative core of the substrate between the first and second surfaces.

16. The semiconductor package of claim 11, wherein the circuit patterns of the first surface of the first and second substrates are electrically coupled to the circuit patterns of the second surface of the substrate by circuit patterns extending over a fourth surface of the substrate that is parallel to and opposite the third surface of the substrate.

17. The semiconductor package of claim 11, further comprising a first insulating layer covering the active surface of the semiconductor die and the first surface of the first and second substrates, a second insulating layer covering the first insulating layer, and conductive first circuit patterns extending through the first and second insulating layers, wherein the bond pads of the semiconductor die are electrically coupled to the circuit patterns of the first surface of the first and second substrates through the first circuit patterns.

18. The semiconductor package of claim 17, wherein a surface of the first circuit patterns is exposed through an outer surface of the second insulating layer.

19. The semiconductor package of claim 11, wherein the active surface of the semiconductor die and the first surface of the substrate are together covered by a layer of an insulating material, and the inactive surface and the remaining two of the four side surfaces of the semiconductor die are exposed.

20. A semiconductor package comprising:

a semiconductor die comprising an active surface with bond pads thereon, an opposite inactive surface, and four peripheral side surfaces extending between the active and inactive surfaces;

first and second substrates each comprising a first surface, a second surface opposite and parallel to the first surface, a third surface extending between the first and second surfaces, and conductive circuit patterns at the first and second surfaces, wherein the third surface of the first substrate is coupled only to a first of the four side surfaces of the semiconductor die, the third surface of the second substrate is coupled only to a second of the four side surfaces of the semiconductor die, with the second side surface being opposite and parallel to the first side surface of the semiconductor die, and the first surface of the first and second substrates is coplanar with the active surface of the semiconductor die, wherein at least some of the circuit patterns of the first surface of the first and second substrates are electrically coupled through the respective substrate to at least some of the circuit patterns of the second surface of the substrate, and wherein some of the bond pads of the semiconductor die are electrically coupled by bond wires to the circuit patterns of the first surface of the first substrate, and some of the bond pads of the semiconductor die are electrically coupled by bond wires to the circuit patterns of the first surface of the second substrate;

solder balls electrically coupled to the circuit patterns of the second surface of the first and second substrates, whereby the solder balls of the first and second substrates are electrically coupled to the semiconductor die; and a layer of an encapsulant overlying the active surface of the semiconductor die, the bond wires, and the first surface of the first and second substrates, wherein the inactive surface of the semiconductor die and the remaining two of the four side surfaces of the semiconductor die are exposed.

* * * * *